HIGH-SPEED LOW-DRIFT ELECTRONIC COMPARATOR HAVING POSITIVE AND NEGATIVE FEEDBACK PATHS

Filed May 3, 1965

INVENTOR.
EDWARD O. GILBERT

INVENTOR.
EDWARD O. GILBERT
BY
Richard D. Stephens

United States Patent Office 3,353,033

Patented Nov. 14, 1967

3,353,033

HIGH-SPEED LOW-DRIFT ELECTRONIC COMPARATOR HAVING POSITIVE AND NEGATIVE FEEDBACK PATHS

Edward O. Gilbert, Ann Arbor, Mich., assignor to Applied Dynamics, Inc., Ann Arbor, Mich., a corporation of Michigan Filed May 3, 1965, Ser. No. 452,634
8 Claims. (Cl. 307—88.5)

ABSTRACT OF THE DISCLOSURE

A high-speed low-drift electronic comparator comprising an amplifier having a continuously operable positive feedback path having a feedback factor $\beta_P$, and a negative feedback path having a feedback factor $\beta_N$ operable when the amplifier output attempts to exceed selected output signal levels, non-linear input lead compensation circuits arranged to provide less lead compensation at increasing input signal velocities, and a chopper-stabilized re-balancing circuit to minimize drift.

Figure 1:
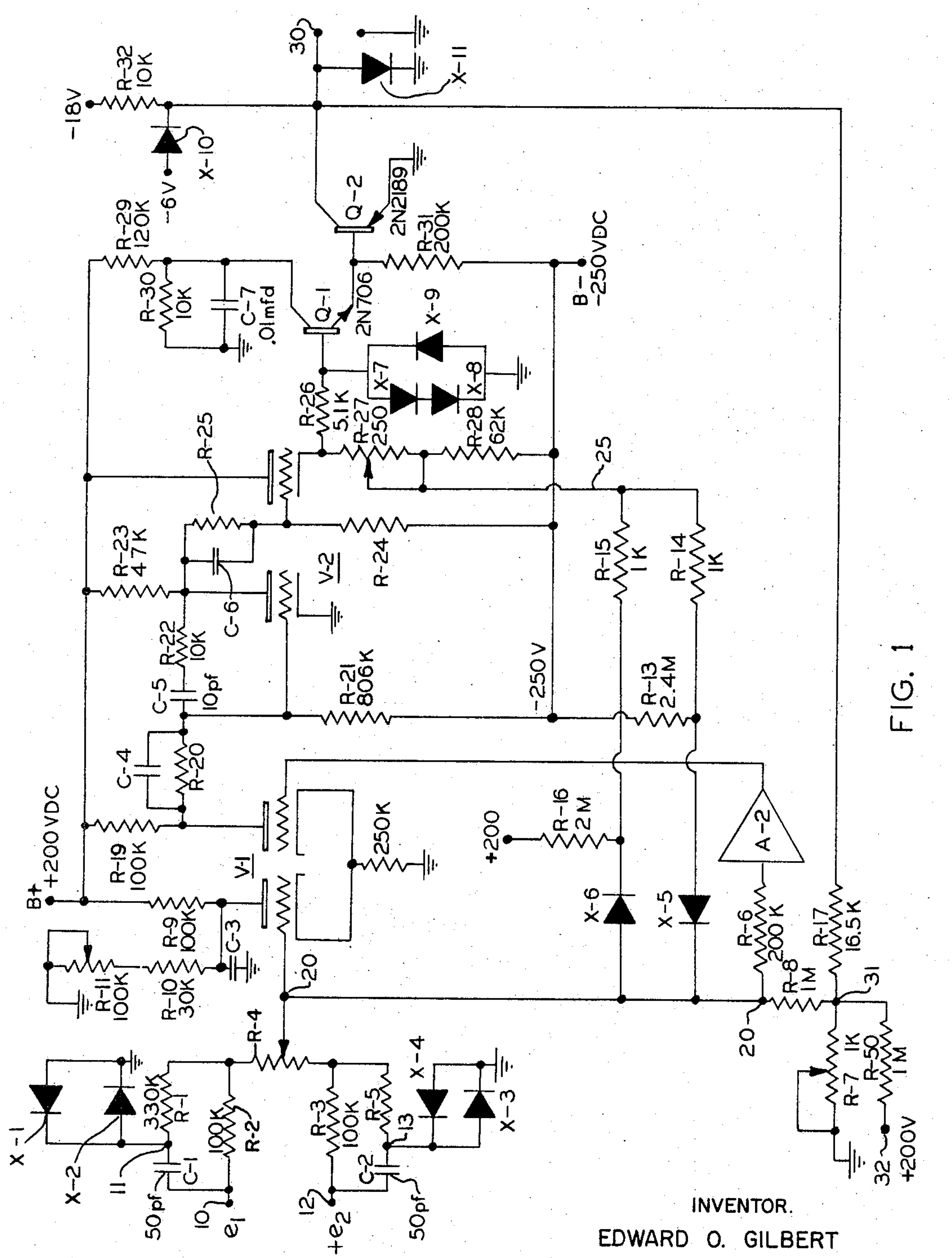

This invention relates to electronic comparison circuits, and more particularly, to an improved electronic comparator having minimum drift, extremely high speed, a precisely-defined comparison level, and high input impedance. The invention is particularly useful in connection with electronic analog (and hybrid analog-digital) computers, instrumentation, and controllers. In a wide variety of such applications, means are required to compare either a single signal (or the sum of a plurality of signals) with a reference level, such as zero, to provide, for example, a first level output signal when the resultant input signal or signal sum is greater than zero, and to provide a markedly different level output signal when the resultant input signal is less than zero. In most such applications it is very important that the comparator output signal change *exactly at* a desired and known comparison point, that the comparator output signal change as soon as the comparison point is crossed, with minimum time delay, and further, that the two output levels of the comparator be markedly different signal levels. If comparator output is plotted against either a single input or the albegraic sum of two or more comparator inputs, the output of an ideal comparator is a vertical line at the comparison point.

In the prior art, it has been common to use ordinary high-gain, direct-coupled feedback amplifiers for comparators. For example, if two input signals are applied to an ordinary feedback summing amplifier, the polarity of the summing amplifier output will change when the sign of the sum of the two input signals changes. However, unless the summing amplifier input scaling resistors are of extremely low impedance compared to the amplifier feedback impedance, the amplifier output will not change vertically, or even sufficiently steeply at a well-defined comparison point, but instead will change proportionally over some range of input signal values. It is a primary object of the invention to provide improved comparators which operate at well-defined comparison points.

It is also possible and within the scope of the prior art to operate direct-coupled amplifier stages open-loop with high gain, so that extremely small differences between the two input signals cause the amplifier stages to either saturate or cut off, and thereby provide a quite steep switching characteristic, but open-loop direct-coupled amplifier stages are very subject to drift, so that the comparison point in such a prior comparator tends to vary with tube (or transistor) age and temperature and cannot be relied on for accurate computation. It is a further very important object of the invention to provide a comparator which is not subject to drift, and which still has a steep switching characteristic. It will be seen that the requirement for extremely high gain at the comparison point, which requirement suggests open-loop operation, is seemingly inconsistent with the use of negative feedback, which would appear to be necessary if direct-coupled amplifier drift is to be avoided. In accordance with the invention, an amplifier is provided with a negative feedback path and thus made amenable to drift stabilization by a conventional AC-coupled stabilizer amplifier, but also provided with a positive or regenerative feedback path, which provides the greater gain needed for rapid transition at the comparison point.

While an ideal comparator handling ideal input signals would have a perfectly vertical characteristic, the signals applied to any practical comparator invariably are accompanied by some noise, and any actual input signal intended to represent zero will carry some noise components, so that a theoretically ideal comparator might switch randomly back and forth when such an input signal is applied to it. In a practical comparator it is highly desirable that one be able to establish a comparator deadband of known and controllable width, in order that the comparator be made insensitive to noise signals below a selected magnitude. It is important, however, that any technique used to establish such a deadband not lessen the steepness of the comparator characteristic and further, that the width of the "deadband" not vary with input signal rate-of-change, and it is an important object of the invention to provide such an improved comparator.

In the prior art, most comparators have had a time lag which was undesirably large unless the input signal rate of change was large as it passed through the comparison point, and in order to lessen the time lag, input circuits of undesirably low impedance have been required. One of the most important objects of the invention is to compensate for comparator time lag but not require a low impedance comparator input circuit.

Other objects of the invention will in part be obvious and will in part appear hereinafter.

The invention accordingly comprises the features of construction, combination of elements, and arrangement of parts, which will be exemplified in the construction hereinafter set forth, and the scope of the invention will be indicated in the claims.

Figure 2A:
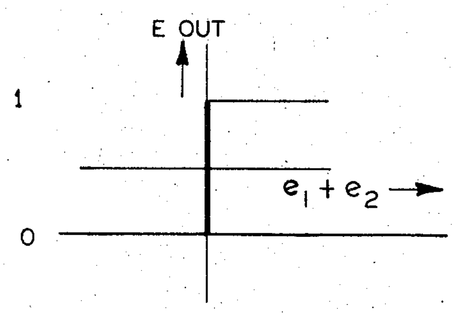
Figure 2B:
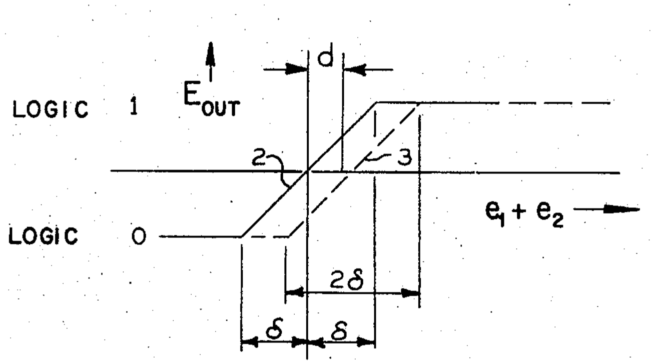
Figure 2C:
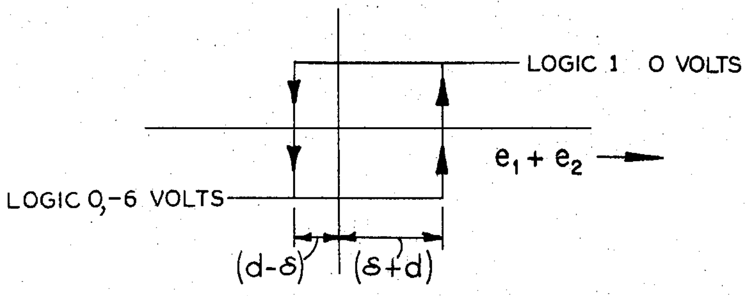

For a fuller understanding of the nature and objects of the invention reference should be had to the following detailed description taken in connection with the accompanying drawing, in which:

FIG. 1 is an electrical schematic diagram of one exemplary form of the invention; and FIGS. 2*a*, 2*b* and 2*c* are graphic diagrams useful in understanding the characteristics of comparator circuits.

An ideal comparator for two input signals $e_1$ and $e_2$ would have the static characteristics indicated in FIG.

2*a*, wherein the comparator output is at a first level ("0") whenever the input sum $e_1+e_2$ is less than zero, and at a second level ("1") whenever the input sum $e_1+e_2$ is greater than zero, and wherein the comparator switches exactly at the point where $e_1+e_2$ exactly equals zero.

The less than ideal characteristics of a practical comparator may be better understood by reference to FIG. 2*b*. In prior art comparators comprising feedback amplifiers, the comparator characteristic is not vertical at the comparison point (i.e., where $e_1$ equals $-e_2$ or $e_1+e_2=0$), but instead has a slope. If the amplifier open-loop gain is extremely high, the slope of the amplifier characteristic surrounding the comparison point is approximately $$R_f/R_{in}$$

wherein $R_f$ and $R_{in}$ are the amplifier input and feedback impedances, respectively. In FIG. 2*b*, the characteristic of such an amplifier which has not drifted is shown in solid lines at 2, while the characteristic of an amplifier comparator which has drifted an amount *d* is shown by a dashed line at 3. As shown by line 2, when the comparator has not drifted, the output signal when $e_1$ exactly equals $-e_2$ lies not at either significant output value "0" or "1," but instead at some intermediate value within a zone of uncertainty shown in FIG. 2*b* with a width $2\delta$. If the comparator has not drifted, it will be seen that a signal input increase of $+\delta$ would be required to insure a "1" output, or a signal input decrease of $-\delta$ would be required to insure a "0" output. In the dashed line characteristic of FIG. 2*b*, where the system is shown drifted by amount *d*, it will be seen that an input level of $d+\delta$ is required to insure a "1" output, and an input level of $d-\delta$ is required to insure a "0" output.

In accordance with the invention, the ill-defined center region of uncertainty is avoided by provision of a hysteresis feature, the nature of which may be better understood by reference to FIG. 2*c*. Switching from logic zero to logic one occurs at a value $(\delta+d)$ of sum input voltage, while switching from logic one back to logic zero occurs at a different value $(d-\delta)$ of input voltage. As suggested by the vertical switching characteristics shown, transition between the two logic states may be made to occur very rapidly. It may be noted that because of the hysteresis in the characteristic of the new comparator, a noise pulse of magnitude $2\delta$ would be required to change the state of the comparator. The invention includes means for adjusting the comparator characteristic to provide a desired value of $\delta$, which value may be selected to provide a desired compromise between comparator resolution and noise suppression. By use of a modulated-carrier stabilizer amplifier, comparator drift *d* is held to a very small value in the invention.

As will be seen, the comparator of the present invention comprises four main parts: input compensating circuits, a high-gain, high-bandwidth negative-feedback amplifier with an associated stabilizing amplifier, a high-speed inverting amplifier and an overall positive feedback circuit. The input compensating circuits minimize comparison time delay for a wide range of signal input velocities (rates of change) but present relatively high input impedances to the input signal sources. The stabilized negative feedback amplifier uses a diode feedback circuit to provide very high gain at the comparison point but limit output voltage excursion on either side of the comparison point. The inverting amplifier further speeds the comparator output transition. The positive feedback circuit provides the desired hysteresis characteristic and further speed improvement.

As will be seen as the description proceeds, the comparator of the present invention comprises a high-gain amplifier having both a positive feedback circuit and a negative feedback circuit. During a selected range of output signal values, the positive feedback factor ($\beta_P$) is arranged to be much greater than the negative feedback factor ($\beta_N$), so that the overall operation of the amplifier circuit will be regenerative, and like any regenerative direct-coupled amplifier, bi-stable. The provision of strong positive feedback speeds transition from one stable state to the other. The two feedback circuits are arranged, however, so that the negative feedback factor becomes greater than the positive feedback factor as the output signal level exceeds the selected range.

Referring now to FIG. 1, the two input signals $e_1$ and $e_2$, the sum of which is to be compared with zero, are applied to input terminals 10 and 12, respectively. The $e_1$ input signal is applied via resistor R–2 to one end of the winding of potentiometer R–4, and the $e_2$ input signal is applied to the other end of the winding via resistor R–5. The wiper arm of the potentiometer, which is connected to the summing junction 20 of a high bandwidth negative-feedback stabilized amplifier, may be adjusted to allow precise calibration of the summing ratio desired. A network (comprising resistor R–1, capacitor C–1 and oppositely-poled diodes X–1 and X–2) connected across summing resistor R–2 provides non-linear compensation of dynamic errors caused by changes in the $e_1$ input signal, and a similar network (R–5, C–2, X–3 and X–4) associated with summing resistor R–3 similarly compensates for dynamic errors caused by changes in the $e_2$ input signal. Diodes X–1, X–2, X–3 and X–4 preferably comprise superior-quality silicon diodes having very low capacity and very low switching times. Operation of these compensation circuits will be explained below.

Also applied to summing junction 20 via scaling resistor R–8 is a feedback potential $e_3$ present at terminal 31. As shown in FIG. 1, the value of the $e_3$ feedback potential will be either plus or minus $10\delta$, and with resistance R–8 ten times as great as R–2 and R–3, the input current to the summing junction will be seen to vary in accordance with $\delta$. The value of the $e_3$ voltage at terminal 31 will be seen to depend upon the system output voltage at terminal 30 and the bias voltage applied via resistance R–50. In FIG. 1 the system output voltage was chosen to swing between zero and $-6$ volt levels because those levels are widely used in commercially available logic circuits. The bias signal applied to terminal 31 via resistor R–50 merely biases terminal 31 upwardly, so that the $e_3$ feedback voltage at terminal 31 swings equally plus and minus about zero as the output at terminal 30 swings between zero and $-6$ volts. The system output circuit (Q–2) could be altered to swing between $+3$ and $-3$ volt levels for example, if desired, and then bias resistor R–50 could be eliminated.

Assuming that potentiometer R–4 is adjusted to the midpoint of its winding, it will be seen that summing junction 20 will lie at ground potential if the sum of the three signals applied to junction 20 equals zero, but at a small voltage of one polarity or the other if the sum of the three signals is greater or less than zero. The voltage will be small because of negative feedback through diodes X–5 and X–6 and a stabilizer amplifier A–2.

Tubes V–1 and V–2 are the active devices of the mentioned negative-feedback amplifier, and the negative feedback path extends from potentiometer R–27 and terminal 25 in the V–2 cathode circuit to summing junction 20 via diode X–5 or X–6. Tube V–1 comprises a conventional differential input stage. The differential stage may be balanced by adjustment of potentiometer R–11 in conventional fashion. The summing junction 20 is connected to one grid of V–1, and via isolation resistor R–6 to a conventional chopper-modulated carrier-type stabilizer amplifier A–2, the output of which is connected in conventional fashion to the other grid of V–1. The output signal of the differential stage is applied via resistor R–20 (paralleled by shaping capacitor C–4) to the grid of a further inverting stage comprising the left side of tube V–2. The output from the left plate of V–2 is applied via a voltage divider (R–25, R–24) to the right side grid of tube V–2, which side is connected as a cathode follower stage. Tubes V–1 and V–2 amplify (and the left side of tube V–2 inverts) the signal at summing junction 20, providing an output signal from cathode-follower half of V–2. In a typical embodiment of the invention, the open-loop voltage gain between summing junction 20 and the cathode follower output is of the order of 200 at DC, which is augmented by a gain in stabilizer amplifier A–2 of 1000, typically. The output signal taken from a voltage divider (R–27, R–28) in the cathode circuit of the cathode follower is applied degeneratively to summing junction 20, via resistor R–14 and diode X–5 when the amplifier output voltage is sufficiently positive, and via resistor R–15 and diode X–6 when the amplifier output voltage is sufficiently negative. Assuming that summing junction 20 is driven slightly positive, the voltage on the arm of potentiometer R–27 will begin to swing negative. If diode X–6 were not back-biased by resistor R–16, a small feedback current would begin to flow as soon as the potential on the arm of R–27 became negative, would increase exponentially throughout the contact potential range of diode X–6, and the diode would be fully "on" with low impedance when the negative feedback voltage from R–27 reached the X–6 diode contact potential. However, in preferred embodiments of the invention, resistor R–16 applies a back-bias of approximately 0.1 volt to diode X–6, so that no feedback current begins to flow through diode X–6 until the feedback voltage on conductor 25 exceeds 0.1 volt, and diode X–6 does not become fully "on" until the feedback voltage reaches 0.1 volt plus the diode contact potential. Because diode X–6 has very large back-resistance until the feedback voltage substantially exceeds 0.1 volt, the amplifier then has no negative feedback path, and a very small change in voltage at summing junction 20 results in a larger (e.g., 200 times) change on conductor 25. A negative voltage is shown applied through fairly large resistor R–13 to back-bias diode X–5 to provide increased diode resistance at the comparator switch point, and a positive voltage similarly applied via resistor R–16 to back-bias diode X–6. Because of the heavy negative feedback applied through the low-value feedback resistors (R–14, R–15) when either one does begin to conduct, the amplifier output is limited to a small voltage, of the order of plus or minus 0.7 volt at the arm of potentiometer R–27. Silicon diodes X–6 and X–7 are preferably selected to have very low shunt capacity to assure high speed operation.

The back-biasing of diodes X–5 and X–6 provides higher gain adjacent the comparison point and hence improved comparator speed, but in some applications of the invention is is unnecessary to back-bias diodes X–5 and X–6, and in such applications resistances R–16, R–13, R–15 and R–14 may be omitted, and diodes X–5 and X–6 connected directly to terminal 25 with some sacrifice in comparator speed. While the negative feedback circuit including diodes X–5 and X–6 may be biased as mentioned and hence "delayed," in the sense of "delayed AVC," so that little or no negative feedback current flows until the summing junction input swings outside a selected voltage range, the regenerative or positive feedback circuit is not "delayed," and an increase of the summing junction signal from zero in one direction immediately results in an increase in the $e_3$ feedback potential (at terminal 31) in the same direction.

The output voltage from the right-side cathode of tube V–2 is applied to the base of an emitter follower stage comprising NPN transistor Q–1, and the output signal from the emitter of Q–1 is connected directly to control output gate transistor Q–2, shown as comprising a PNP type transistor. With summing junction 20 at ground potential, potentiometer R–27 may be adjusted so that the base of transistor Q–2 is established substantially midway between its cutoff level and a saturation level. Upon the occurrence of an extremely small voltage at summing junction 20, transistor Q–1 provides current gain, thereby switching output gate transistor Q–2 either on or off. Since Q–1 is an emitter-follower stage (and non-inverting), and Q–2 is a grounded emitter stage (which inverts), it will be seen that there is one sign inversion between point 25 and terminal 30. Approximately .05 volt output on the R–27 arm is required to insure that Q–2 is switched in one direction or the other from a balanced condition. With an open-loop high-frequency gain of 200 in V–1 and V–2, it will be seen that a voltage of only .25 millivolt at summing junction 20 is required at high frequencies in order to provide approximately .05 volt at R–27, and statically, because of the great (1000) gain of stabilizer amplifier A–2 at low frequencies, only about .25 microvolt is required to insure switching of Q–2. Diodes X–7, X–8 and X–9 protect transistor Q–1 from being overdriven by tube V–2. Diode X–11 clamps the comparator output voltage at terminal 30. Diode X–10 prevents output voltage excursions more negative than −6 volts. In addition, diode X–10 and X–11 prevent externally applied voltages which might accidentally be connected to output terminal 30 from damaging transistor Q–2, thereby protecting the circuit against patching mistakes if the circuit is used in a general purpose computer. Transistors Q–1 and Q–2 are preferably opposite conductivity types as shown, and thus have approximately equal magnitude but opposite-sense base-to-emitter junction potential thermal coefficients, which results in low thermal drift of the bias adjustment effected by adjustment of the arm of potentiometer R–27.

The comparator output signal at terminal 30 is fed back as shown, via resistances R–17 and R–8 to summing junction 20. While the first feedback path (i.e. that through X–5 or X–6) around the amplifier is negative, or degenerative, the inversion in the Q–2 transistor stage renders the feedback applied through R–17 and R–8 regenerative. This feedback establishes the above-mentioned hysteresis gap in the comparator switching characteristic, as well as increasing switching speed. By adjustment of potentiometer R–7, one may adjust the amount of the positive feedback and thereby adjust the width of the hysteresis gap. Increasing the resistance of R–7 will be seen to increase the width $\delta$ of the hysteresis gap.

Because the voltage level at R–27 required to switch transistor Q–2 through transistor Q–1 is less than that required for either diode X–5 or X–6 to conduct, the amplifier operates open-loop (over a fraction of a millivolt input signal swing at the summing junction) until transistor Q–2 is switched, applying positive feedback via R–17 and R–8, and the provision of positive feedback automatically and very quickly raises the amplifier input and output levels to where either diode X–5 or diode X–6 conducts and negative feedback limiting occurs.

Both from theory and from experiment, it is known that the speed with which a comparator will provide an output indication depends not only upon the value of the resultant input signal $e$ (the sum of $e_1$ and $e_2$), but also upon its rate of change as it passes through zero. Dynamically, the comparator error components due to input signal rate of change may be expressed as $\delta+\Delta(V)$ and $d+D(V)$, where $\Delta(V)$ is the increase in the resolution error due to input signal time rate of change, and where $D(V)$ is the increase in drift error due to input signal rate of change. Thus comparator timing error $T(V)$ may amount to as much as $$T(V)=\frac{|\Delta(V)|+|D(V)|}{V}$$

Timing error obviously is insignificant when $\Delta V+D(V)$ is less than static error. In prior art comparators, output signals all occurred with a considerable time delay unless the input signal was changing very rapidly when it passed through zero. It is highly desirable that the time lag of the comparator be much smaller, and further that it vary much less, or ideally, not at all, with input signal velocity. In some prior art comparators, attempts were made to decrease comparator time delay by using very small input summing resistances, which is quite disadvantageous in that it requires more current from the input voltage source devices. Comparator speed is particularly important in comparators used with smoothly yet rapidly varying inputs, which occur very frequently in hybrid analog-digital computation, for example.

In the invention, the time lead provided by capacitor C–1 and resistor R–1 paralleling input scaling resistor R–2 compensates for the comparator time lag during low velocity input signals. When the input signal applied at terminal 10 has a low time rate of change, it will be seen that the potential at terminal 11 will be low, so that neither diode X–1 nor diode X–2 will conduct, and all of the lead current through capacitor C–1 will flow toward (or from) summing junction 20. However, as the velocity or rate of change of the input signal increases, so that the voltage at terminal 11 increases, some of the lead current through C–1 will flow through diode X–1 or diode X–2, depending upon the direction of the change, thereby giving less lead time compensation or anticipation with increasing input signal velocity. Because time lag $\Delta(V)/V$ in the remainder of the comparator behaves similarly, effective compensation of the time lag may be provided over a large range of input signal velocities. The values of R–1 and C–1 depend, of course, upon the contact potentials of the diodes used as X–1 and X–2 and the measured time-delay characteristic of the remainder of the comparator. By use of the input compensation circuits shown, comparator speed has been improved in practice by a factor of 5 to 10, without the need for using very low value scaling resistors at R–2 and R–3, which, as mentioned above, would require more powerful sources to supply the input voltages $e_1$ and $e_2$.

While the invention has been shown using some vacuum tube amplifier stages and some transistorized switching and amplifying circuits, it will be apparent to those skilled in the art that the invention can as well use transistorized amplifier stages, for example. Obviously, as many additional input circuits as desired may be added to compare the sum of any plurality of input signals with zero.

It will thus be seen that the objects set forth above, among those made apparent from the preceding description, are efficiently attained, and since certain changes may be made in the above constructions without departing from the scope of the invention, it is intended that all matter contained or shown in the accompanying drawings shall be interpreted as illustrative and not in a limiting sense.

Having described my invention, what I claim as new and desire to secure by Letters Patent is:

1. A high-speed electronic comparator circuit for comparing first and second input voltages, comprising, in combination:

a first input terminal for receiving said first input voltage; a second input terminal for receiving said second input voltage;

a summing junction;

a first impedance connected between said summing junction and said first input terminal; a second impedance connected between said summing junction and said second input terminal;

an amplifier connected to amplify the signal at said summing junction to provide an output voltage having a first or a second level dependent upon the polarity of the signal at said summing junction;

a first switching circuit responsive to said output voltage and operative to apply a regenerative feedback voltage continuously to said summing junction;

and a second switching circuit responsive to said output voltage and operative to apply an input voltage degeneratively to said summing junction immediately upon excursion of said output voltage outside a selected range of values.

2. A comparator according to claim 1 in which said first impedance comprises a first resistance connected between said input terminal and said summing junction; a capacitor and a second resistance connected in series with each other and in parallel with said first resistance, and a pair of oppositely-poled diodes connected in parallel from the junction point between said capacitor and second resistance to a point of reference potential.

3. Apparatus according to claim 1 in which said second switching circuit comprises a first feedback impedance for applying said output voltage to said summing junction through a first diode, a second feedback impedance for applying said output voltage to said summing junction through a second diode, said first and second diodes being oppositely-poled; and means for reverse-biasing said first and second diodes to prevent application of said output voltage to said summing junction through either of said feedback impedances except upon excursion of said output voltage outside said selected range of values.

4. Apparatus according to claim 1 in which said first switching circuit comprises an amplifying stage responsive to said output voltage and operative to switch between two opposite states in accordance with the polarity of said signal at said summing junction, and further impedance means connecting said amplifying stage to said summing junction.

5. A comparator according to claim 1 in which said amplifier comprises a direct-coupled amplifier having a drift-correction input circuit, and in which said comparator includes a modulated-carrier stabilizer amplifier responsive to the signal at said summing junction and operative to apply a balancing signal to said drift-correction input circuit.

6. A high-speed electronic comparator, comprising in combination:

a direct-coupled amplifier having an input terminal, a summing junction terminal and a plurality of amplifying stages and operative to provide an output voltage;

first circuit means comprising a positive feedback circuit responsive to said output voltage for continuously direct-coupling a first feedback signal to said summing junction terminal and bi-directional limiter means for limiting said first feedback signal to a range between first and second levels;

and second circuit means responsive to said output voltage for connecting a negative feedback path around said amplifier upon excursion of said output voltage outside third and fourth levels.

7. A high-speed electronic comparator, comprising, in combination:

a direct-coupled amplifier having an input stage including first and second input impedances connected to a summing junction terminal and a plurality of amplifying stages and operative to provide an output voltage;

means responsive to the magnitude of said output voltage for continuously direct-coupling a regenerative feedback signal path to said summing junction terminal of said amplifier;

voltage-limiter circuit means connected to limit the feedback signal coupled over said regenerative feedback signal path to between two selected values;

a modulated-carrier stabilizer amplifier channel connected to be responsive to the signal at said summing junction and operative to apply a re-balancing signal to said input stage; and a negative feedback circuit for applying a degenerative signal to said input stage upon excursion of said output voltage outside two further selected values.

8. A comparator according to claim 1 having first and second scaling resistors connected to said summing junction terminal and to respective input terminals, a resistance-capacitance lead circuit connected in parallel with each of said scaling resistors, and a pair of mutually-parallel oppositely-poled diodes connected between each lead circuit and a point of reference potential to limit the flow of current through said lead circuits to said summing junction when rapidly varying input signals are applied to said input terminals.

References Cited

UNITED STATES PATENTS

| | | | |
|---|---|---|---|
| 2,401,779 | 6/1946 | Swartzel | 330—69 |
| 2,651,717 | 9/1953 | Uttley et al. | 330—104 XR |
| 2,924,781 | 2/1960 | Wilson et al. | 330—104 |
| 2,977,547 | 3/1961 | Talambiras | 330—104 XR |
| 2,994,825 | 8/1961 | Anderson | 330—69 XR |
| 3,104,358 | 9/1963 | Heacock | 330—104 XR |
| 3,225,216 | 12/1965 | Grabowski | 330—104 XR |
| 3,227,895 | 1/1966 | Gray | 328—147 XR |

ARTHUR GAUSS, *Primary Examiner.*

J. JORDAN, *Assistant Examiner.*